United States Patent [19]

Penney

[11] Patent Number: 4,985,702

[45] Date of Patent: Jan. 15, 1991

[54] ANALOG TO DIGITAL CONVERTER WITH SECOND ORDER ERROR CORRECTION

[75] Inventor: Bruce J. Penney, Portland, Oreg.

[73] Assignee: Triquint Semiconductor, Inc., Beaverton, Oreg.

[21] Appl. No.: 502,953

[22] Filed: Apr. 2, 1990

[51] Int. Cl.⁵ .............................................. H03M 1/06
[52] U.S. Cl. ..................................... 341/118; 341/155
[58] Field of Search ............... 341/118, 119, 120, 155, 341/158, 159

[56] References Cited

U.S. PATENT DOCUMENTS 4,746,902  5/1988  Tol et al. ............................. 341/118
4,903,023  2/1990  Evans et al. ......................... 341/118
4,903,024  2/1990  Evans et al. ......................... 341/118
4,908,621  3/1990  Polonio et al. ...................... 341/120

Primary Examiner—William M. Shoop, Jr.
Assistant Examiner—Howard L. Williams
Attorney, Agent, or Firm—Francis I. Gray

[57] ABSTRACT

An analog to digital converter with second order error correction provides a more accurate digital output code for a high frequency input analog signal. A slope of the input signal is determined from the digital output code of a quantizer, and the slope is used to provide a correction value that is a function of the slope. The correction value may also be a function of a level range of the quantizer. The correction value is added to the digital output code to produce a corrected digital output code.

10 Claims, 2 Drawing Sheets

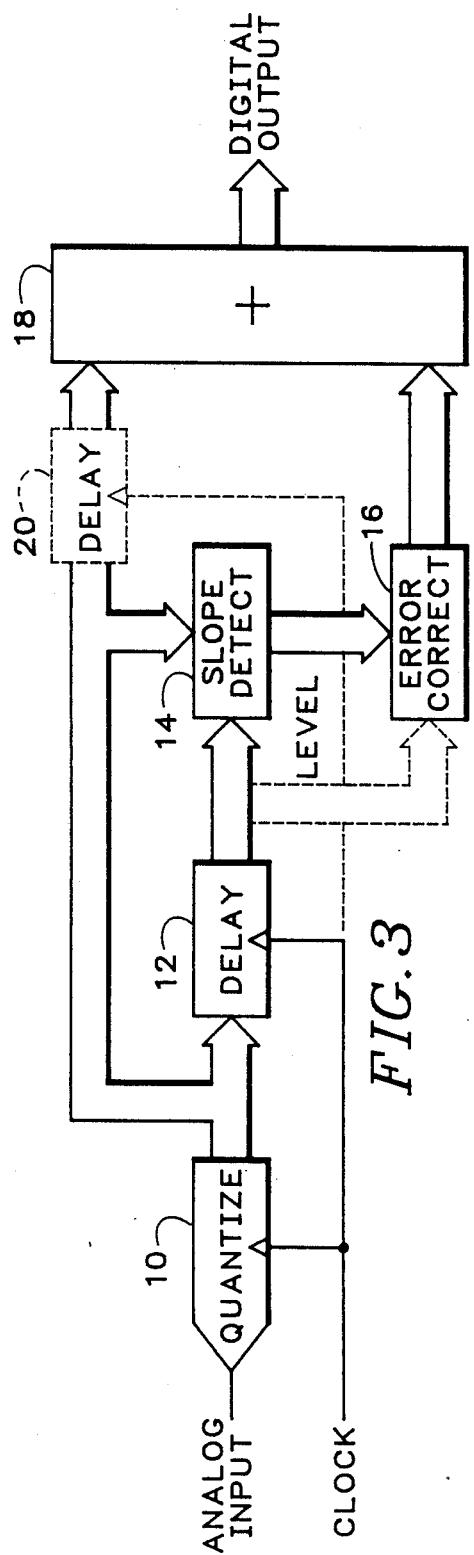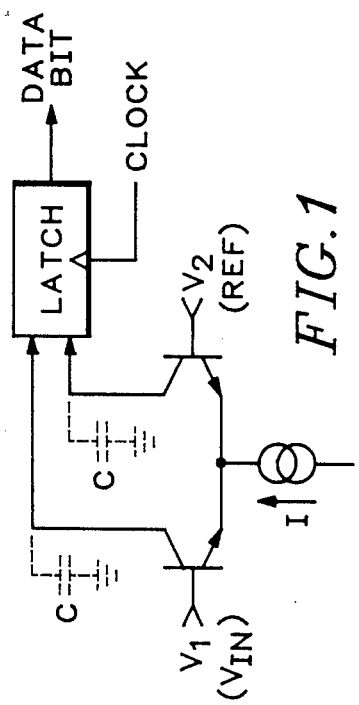

ANALOG TO DIGITAL CONVERTER WITH SECOND ORDER ERROR CORRECTION

BACKGROUND OF THE INVENTION

The present invention relates to analog to digital converters, and more particularly to an analog to digital converter with second order error correction to provide consistent high frequency accuracy.

It is common for analog to digital converter accuracy to degrade at high frequencies. Referring to FIG. 1 consider the typical flash analog to digital comparator cell input. Ideally the comparator senses when the input voltage Vin at terminal V1 matches a reference voltage Vref at terminal V2 of a differential amplifier. However practically the finite emitter current I and circuit capacitances C introduce an input slope, i.e., slew rate, dependent term in the comparator sense points that is a function of the frequency of the input voltage Vin. At high frequencies this results in the noted accuracy degradation. As shown in FIG. 2 for a representative ten-bit ADC at two megahertz the effective number of bits for the ADC is reduced to nine bits, at 20 MHz it is further reduced to eight bits, and at 80 MHz it is reduced even further to five bits.

Therefore what is desired is an analog to digital converter with second order error correction to compensate for the frequency dependent input slope.

SUMMARY OF THE INVENTION

Accordingly the present invention provides an analog to digital converter (ADC) with second order error correction to maintain effective bits at high frequencies nearly equal to low frequency performance. The output of a quantizer is input to a digital delay line, to one input of an adder and to a slope detector. The output of the delay line also is input to the slope detector. The output of the slope detector is used to address a lookup table that provides a slope dependent correction value to another input of the adder. The output of the adder is the corrected ADC digital output.

The objects, advantages and other novel features of the present invention are apparent from the following detailed description when read in conjunction with the appended claims and attached drawing.

BRIEF DESCRIPTION OF THE DRAWING

FIG. 1 is a schematic view of a typical flash analog to digital converter comparator cell.

FIG. 3 is a block diagram of an analog to digital converter with second order error correction according to the present invention.

DESCRIPTION OF THE PREFERRED EMBODIMENT

Figure 2:
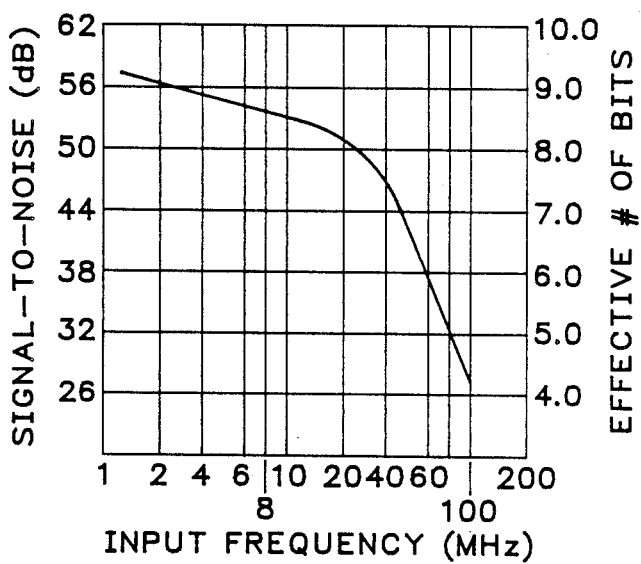
FIG. 2 is a graphic representation of the effective number of bits of a typical analog to digital converter as a function of frequency.

Referring now to FIG. 3 a quantizer 10 is shown having an analog input signal with the conversion being controlled by a clock signal. The digital output code from the quantizer 10 is input to a digital delay line 12 that also is clocked by the clock signal. The delayed quantizer output code from the delay line 12 is input to a slope detector 14 to which also is input the digital output code from the quantizer 10. The slope detector 14 subtracts the current output code from the quantizer 10 from the delayed output code from the delay line 12 to approximate the input signal slew rate or slope. The output from the slope detector 14 is input to an error correction circuit, such as a lookup table 16, that provides a correction code as a function of the input signal slew rate. The quantizer output code and the correction code are input to an adder 18 to provide a corrected ADC output code. The adder 18 may include an appropriate delay 20 for the quantized input signal to match the delays through the slope detector 14 and the error correction circuit 16.

The digital delay line 12 may be in the form of a latch that provides the value presented at its input on the next cycle of the clock signal to provide a one sample delay of the quantizer output code. The slope detector 14 may be in the form of a digital subtraction circuit to obtain the difference between the quantizer output code and the delayed quantizer output code. The lookup table values may be determined by analyzing the response of the ADC to a known high frequency signal having a frequency that is asynchronous with the clock signal. The output of the adder 18 is analyzed by a fast Fourier transform processor to generate values for the lookup table 16 using an iterative process until the output of the adder is an accurate digital representation of the input high frequency signal. Ideally a pure triangular waveform is desired for the known input signal to provide a constant slope over the range of the ADC, but such waveforms are difficult and expensive to achieve. A more practical solution is to use a pure sinusoidal waveform, even though the slope becomes very gradual near the peaks.

Figure 4:
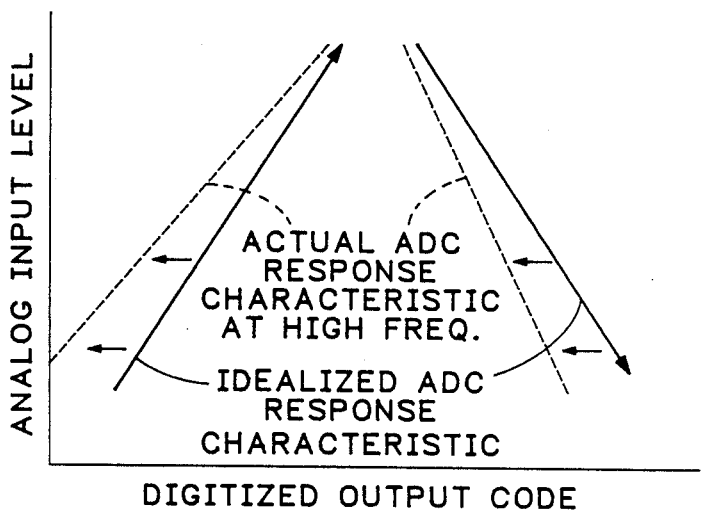
FIG. 4 is a graphic representation of an ideal versus actual response characteristic of an analog to digital converter at high frequencies.

As shown in FIG. 4 the high frequency error on the positive slope may be in one direction with respect to the ideal ADC response, while on the negative slope the high frequency error has the reverse effect. Thus the high frequency error is slope dependent, i.e., is a function of the direction of change of the input signal. Further the high frequency error may also be level dependent so that the error for high input signal levels is less than that for low input signal levels. To compensate for this level differential a portion of the output of the delay line 12 that represents a level ranqe of the quantizer 10 for the input signal sample is input to the lookup table 16 to select a region within the lookup table corresponding to that level range, and the output of the slope detector 14 then accesses only that region within the lookup table for the correction values for input to the adder 18.

Although the present invention has been described in terms of a completely digital embodiment, the slope determination for the input signal may be performed in the analog domain using a differentiator as the slope detector 14, with the output of the differentiator being digitized for input to the error correction circuit 16. Also the error correction circuit 16 may be implemented in the analog domain, and an output correction voltage converted to a digital correction value before being input to the adder 18.

Thus the present invention provides an ADC with second order error correction to compensate for high frequency induced errors by determining the slope of the input signal and generating from the slope a correction value that is a function of the slope and a level range of the input signal for addition to the digital output code of a quantizer.

What is claimed is:

1. An analog to digital converter with second order error correction comprising:
   a quantizer having as an input an analog signal and as an output a digital output code;
   means for determining a slope of the analog signal from the digital output code;
   means for providing as a function of the slope a correction value; and
   means for adding the correction value to the digital output code to produce a second order corrected digital output code.

2. An analog to digital converter as recited in claim 1 wherein the determining means comprises:
   means for delaying the digital output code to produce a delayed digital output code; and
   means for obtaining a difference between the digital output code and the delayed digital output code, the difference being the slope.

3. An analog to digital converter as recited in claim 1 wherein the providing means comprises a lookup table having error correction values, the slope addressing one of the error correction values for output as the correction value.

4. An analog to digital converter as recited in claim 1 wherein the adding means comprises:
   a digital adder having the digital output code as one input and the correction value as another input, and having the second order corrected digital output code as an output; and
   means for delaying the digital output code at the one input of the digital adder to compensate for delays in the determining and providing means.

5. A second order error correction circuit for a quantizer that converts an analog signal to a digital code comprising:
   means for determining a slope of the analog signal from the digital code;
   means for providing as a function of the slope a correction value for addition to the digital code to produce a second order corrected digital code.

6. A second order error correction circuit as recited in claim 5 further comprising means for determining from the digital output code a level range, the correction value from the providing means being a function of both the slope and the level range.

7. A second order error correction circuit as recited in claim 5 wherein the determining means comprises:
   means for delaying the digital output code to produce a delayed digital output code; and
   means for obtaining a difference between the digital output code and the delayed digital output code, the difference being the slope.

8. A second order error correction circuit as recited in claim 5 wherein the providing means comprises a lookup table having error correction values, the slope addressing one of the error correction values for output as the correction value.

9. An analog to digital converter with second order error correction comprising:
   a quantizer having as an input an analog signal and as an output a digital code;
   means for determining a slope of the analog signal;
   means for providing as a function of the slope a digital correction value; and
   means for adding the digital correction value to the digital code to produce a second order corrected digital code.

10. A second order error correction circuit for a quantizer that converts an analog signal to a digital code comprising:
    means for determining a slope of the analog signal; and
    means for providing as a function of the slope a digital correction value for addition to the digital code to produce a second order corrected digital code.

* * * * *

UNITED STATES PATENT AND TRADEMARK OFFICE
CERTIFICATE OF CORRECTION

PATENT NO. : 4,985,702
DATED     : January 15, 1991
INVENTOR(S) : Bruce J. Penney It is certified that error appears in the above-indentified patent and that said Letters Patent is hereby corrected as shown below:

On the Title Page, Item [73], change the assignee to read
—Tektronix, Inc. Beaverton, Orgon—.

Signed and Sealed this

Second Day of August, 1994

Attest:

BRUCE LEHMAN

*Attesting Officer*     Commissioner of Patents and Trademarks